(12) United States Patent
Ueda et al.

(10) Patent No.: US 11,938,547 B2
(45) Date of Patent: Mar. 26, 2024

(54) TURNING TOOL

(71) Applicant: SUMITOMO ELECTRIC HARDMETAL CORP., Itami (JP)

(72) Inventors: Akihiko Ueda, Itami (JP); Takuya Nohara, Itami (JP); Yutaka Kobayashi, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 649 days.

(21) Appl. No.: 16/768,142

(22) PCT Filed: Aug. 2, 2019

(86) PCT No.: PCT/JP2019/030411
§ 371 (c)(1),
(2) Date: May 29, 2020

(87) PCT Pub. No.: WO2020/031871
PCT Pub. Date: Feb. 13, 2020

(65) Prior Publication Data
US 2020/0316691 A1    Oct. 8, 2020

(30) Foreign Application Priority Data
Aug. 6, 2018 (JP) ................. 2018-147806

(51) Int. Cl.
*B23B 27/20* (2006.01)
*B23B 27/14* (2006.01)
(Continued)

(52) U.S. Cl.
CPC ............ *B23B 27/145* (2013.01); *B23B 27/20* (2013.01); *C01B 32/25* (2017.08); *C23C 16/27* (2013.01);
(Continued)

(58) Field of Classification Search
CPC ...... B23B 2200/0447; B23B 2200/201; B23B 2200/242; B23B 2226/31; B23B 27/145;
(Continued)

(56) References Cited

U.S. PATENT DOCUMENTS 5,078,551 A    1/1992  Oomen
5,133,332 A *  7/1992  Tanaka .................. B23B 27/005
                                                        51/293
(Continued)

FOREIGN PATENT DOCUMENTS

JP    H02-198704 A    8/1990
JP    H03-228504 A   10/1991
(Continued)

OTHER PUBLICATIONS

W. J. Zong et al., "Design criterion for crystal orientation of diamond cutting tool", Diamond & Related Materials, Nov. 12, 2008, pp. 642-650.

*Primary Examiner* — Sara Addisu
(74) *Attorney, Agent, or Firm* — Faegre Drinker Biddle & Reath LLP

(57) ABSTRACT

A turning tool includes: a holder portion; and a cutting edge portion fixed to the holder portion, wherein the cutting edge portion is composed of a synthetic single-crystal diamond, and the cutting edge portion has a nose curvature having a curvature radius of more than or equal to 0.1 mm and less than or equal to 1.2 mm, and the nose curvature satisfies at least one of a condition that a direction of a line of intersection between the rake face and a bisecting cross section of a vertex angle of the nose curvature is within ±10° relative to a <110> direction of the synthetic single-crystal diamond, and a condition that the direction of the line of intersection between the rake face and the bisecting cross section of the vertex angle of the nose curvature is within (Continued)

±10° relative to a <100> direction of the synthetic single-crystal diamond.

7 Claims, 2 Drawing Sheets

(51) Int. Cl.
 *C01B 32/25* (2017.01)
 *C23C 16/27* (2006.01)
 *C30B 29/04* (2006.01)
(52) U.S. Cl.
 CPC ........ *C30B 29/04* (2013.01); *B23B 2200/201* (2013.01)
(58) Field of Classification Search
 CPC ....... B23B 27/20; C23C 16/27; C23C 16/274; C01B 32/25; C30B 29/24; C30B 25/186; C30B 25/20
 See application file for complete search history.

(56) References Cited

U.S. PATENT DOCUMENTS

| | | | | |
|---|---|---|---|---|
| 6,540,450 | B2* | 4/2003 | Gatton | B23B 5/02 82/111 |
| 6,612,786 | B1 | 9/2003 | Kanada et al. | |
| 6,655,881 | B2* | 12/2003 | Shimizu | B23B 27/145 407/113 |
| 7,341,408 | B2* | 3/2008 | Kratz | B23B 27/145 407/115 |
| 7,556,456 | B2* | 7/2009 | Yoshinaga | B23B 27/20 407/118 |
| 10,245,644 | B2* | 4/2019 | Kukino | B24B 3/34 |
| 2002/0190105 | A1* | 12/2002 | Kanada | C04B 41/009 228/248.1 |
| 2006/0120816 | A1 | 6/2006 | Morimoto et al. | |
| 2011/0299948 | A1* | 12/2011 | Edler | B23B 27/145 407/115 |
| 2012/0128438 | A1* | 5/2012 | Tanaka | B23B 27/141 407/115 |
| 2015/0176155 | A1 | 6/2015 | Ueda et al. | |
| 2017/0241042 | A1* | 8/2017 | Nishibayashi | C23C 16/27 |
| 2018/0009040 | A1* | 1/2018 | Sasaki | B23B 27/22 |
| 2019/0232453 | A1* | 8/2019 | Maeda | B24B 3/343 |
| 2020/0338645 | A1* | 10/2020 | Moroguchi | B23B 27/145 |
| 2021/0114117 | A1* | 4/2021 | Harada | B23B 27/1611 |
| 2022/0127751 | A1* | 4/2022 | Linares | C30B 29/04 |

FOREIGN PATENT DOCUMENTS

| | | | |
|---|---|---|---|
| JP | H06-126512 A | 5/1994 | |
| JP | H06-190609 A | 7/1994 | |
| JP | 2003-62707 A | 3/2003 | |
| JP | 2003-175408 A | 6/2003 | |
| JP | 2007-181882 A | 7/2007 | |
| RU | 2334550 C2 * | 9/2008 | ............... B01J 3/06 |
| WO | WO-2014/003110 A1 | 1/2014 | |
| WO | WO-2016043127 A1 * | 3/2016 | ........... B23B 27/145 |
| WO | WO-2016/171201 A1 | 10/2016 | |
| WO | WO-2019026698 A1 * | 2/2019 | ............... B23B 1/00 |
| WO | WO-2019087496 A1 * | 5/2019 | ............. B23B 27/00 |

* cited by examiner

TURNING TOOL

TECHNICAL FIELD

The present disclosure relates to a turning tool. The present application claims a priority based on Japanese Patent Application No. 2018-147806 filed on Aug. 6, 2018, the entire content of which is incorporated herein by reference.

BACKGROUND ART

Conventionally, a cutting tool (hereinafter, also referred to as "single-crystal diamond cutting tool") in which a single-crystal diamond is used at least for a cutting edge thereof has been used for processing of a nonferrous metal, and mirror surface processing and precision processing of a plastic or the like. When a single-crystal diamond is used for a cutting edge of a cutting tool, characteristics of the cutting tool such as wear resistance and breakage resistance greatly differ depending on which crystal plane and crystal orientation of the single-crystal diamond are used for rake face and flank face of the cutting tool as disclosed in, for example, WO 2014/003110 (Patent Literature 1).

Hence, a single-crystal diamond cutting tool is produced after selecting more appropriate crystal plane and crystal orientation of the single-crystal diamond in accordance with a user's request, a use condition, and the like. For example, the single-crystal diamond cutting tool of Patent Literature 1 is manufactured to include a cutting edge having a rake face constituted of a (100) plane of a single-crystal diamond, wherein a cutting edge tip corresponds to a <100> direction.

CITATION LIST

Patent Literature

PTL 1: WO 2014/003110

SUMMARY OF INVENTION

A turning tool according to one embodiment of the present disclosure is a turning tool used for turning, the turning tool including: a holder portion; and a cutting edge portion fixed to the holder portion, wherein the cutting edge portion is composed of a synthetic single-crystal diamond, the cutting edge portion includes a rake face, a flank face, and a cutting edge disposed at a crossing portion at which the rake face and the flank face cross each other, and the cutting edge portion has a nose curvature having a curvature radius of more than or equal to 0.1 mm and less than or equal to 1.2 mm, and the nose curvature satisfies at least one of a condition that a direction of a line of intersection between the rake face and a bisecting cross section of a vertex angle of the nose curvature is within ±10° relative to a <110> direction of the synthetic single-crystal diamond, and a condition that the direction of the line of intersection between the rake face and the bisecting cross section of the vertex angle of the nose curvature is within ±10° relative to a <100> direction of the synthetic single-crystal diamond.

DETAILED DESCRIPTION

Figure 1:
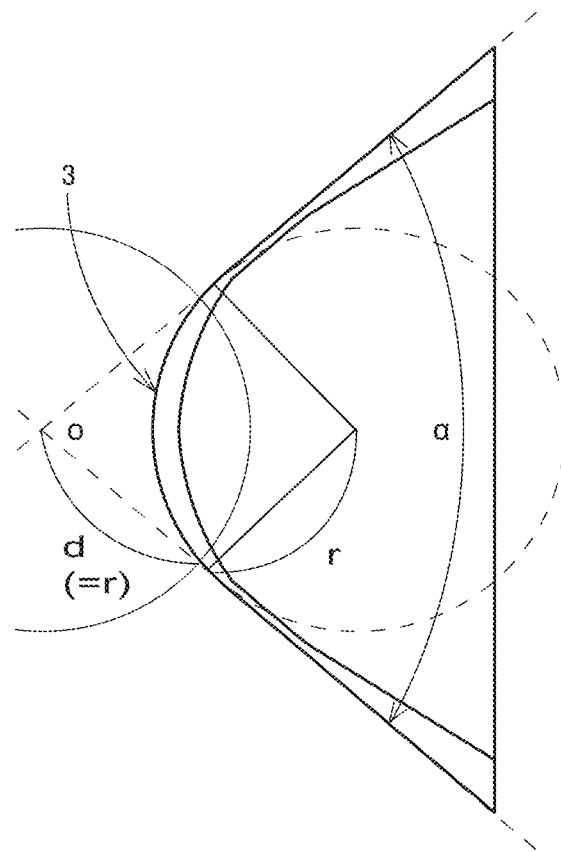
FIG. 1 is an explanatory plan view illustrating a cutting edge portion in a turning tool according to one embodiment of the present disclosure when viewed in a plan view in order to explain the following terms: "nose curvature" as well as "curvature radius", "vertex angle" and "bisecting cross section of the vertex angle" of the "nose curvature".

Problem to be Solved by the Present Disclosure

The above-described single-crystal diamond cutting tool has been hardly used for processing of vehicle components in a market of nonferrous metal processing. This is due to the following reason: if such a single-crystal diamond cutting tool is used for processing under severe conditions generally employed for vehicle components, such as high speed cutting, high feeding, and a deep depth of cut, breakage occurs frequently and wear takes place readily. Hence, in order to attain processing under severe conditions, it has been required to provide an excellent wear resistance to a single-crystal diamond cutting tool. Further, there is a strong request in attaining a smoothly finished surface of a processed product such as a vehicle component.

Under the above-described actual circumstances, the present disclosure has an object to provide a turning tool that has a wear resistance and that attains a smoothly finished processed surface of a workpiece.

Advantageous Effect of the Present Disclosure

According to the description above, there can be provided a turning tool that has a wear resistance and that attains a smoothly finished processed surface of a workpiece.

DESCRIPTION OF EMBODIMENTS

First, embodiments of the present disclosure are listed and described.

[1] A turning tool according to one embodiment of the present disclosure is a turning tool used for turning, the turning tool including: a holder portion; and a cutting edge portion fixed to the holder portion, wherein the cutting edge portion is composed of a synthetic single-crystal diamond, the cutting edge portion includes a rake face, a flank face, and a cutting edge disposed at a crossing portion at which the rake face and the flank face cross each other, and the cutting edge portion has a nose curvature having a curvature radius of more than or equal to 0.1 mm and less than or equal to 1.2 mm, and the nose curvature satisfies at least one of a condition that a direction of a line of intersection between the rake face and a bisecting cross section of a vertex angle of the nose curvature is within ±10° relative to a <110> direction of the synthetic single-crystal diamond, and a condition that the direction of the line of intersection between the rake face and the bisecting cross section of the vertex angle of the nose curvature is within ±10° relative to a <100> direction of the synthetic single-crystal diamond. The turning tool having such a feature has a wear resistance, and can attain a smoothly finished processed surface of a workpiece.

[2] Preferably, the direction of the line of intersection is within ±5° relative to the <110> direction of the synthetic single-crystal diamond. Accordingly, the turning tool has a higher wear resistance, and can attain a smoothly finished processed surface of a workpiece.

[3] Preferably, the direction of the line of intersection is within ±5° relative to the <100> direction of the synthetic single-crystal diamond. Accordingly, the turning tool has a higher wear resistance, and can attain a smoothly finished processed surface of a workpiece.

[4] Preferably, the synthetic single-crystal diamond includes more than or equal to 1 ppm and less than or equal to 100 ppm of nitrogen atoms. Accordingly, the turning tool can be also excellent in breakage resistance.

[5] Preferably, the vertex angle is more than or equal to 55° and less than or equal to 90°. Accordingly, a balance between cutting resistance and cutting edge strength can be excellent in the turning tool, thus resulting in improved wear resistance and breakage resistance.

[6] Preferably, the turning is performed under a condition that a relief angle is more than or equal to 7° and less than or equal to 15°. Accordingly, the turning tool can attain a more smoothly finished processed surface of a workpiece.

[7] Preferably, the turning is performed under a condition that a feed f is more than or equal to 0.01 mm/rev and less than 0.7 mm/rev. Accordingly, the turning tool can attain a more smoothly finished processed surface of a workpiece.

[8] Preferably, the synthetic single-crystal diamond is a CVD single-crystal diamond. Accordingly, the turning tool has a more sufficient wear resistance, and can attain a smoothly finished processed surface of a workpiece.

DETAILS OF EMBODIMENTS OF THE PRESENT DISCLOSURE

The following describes an embodiment of the present disclosure (hereinafter, also referred to as "the present embodiment") more in detail, but the present embodiment is not limited thereto. In the description below, explanation will be made with reference to figures.

Here, in the present specification, the expression "A to B" represents a range of lower to upper limits (i.e., more than or equal to A and less than or equal to B). When no unit is indicated for A and a unit is indicated only for B, the unit of A is the same as the unit of B. When a compound or the like is expressed by a chemical formula in the present specification and an atomic ratio is not particularly limited, it is assumed that all the conventionally known atomic ratios are included. The atomic ratio is not necessarily limited only to one in the stoichiometric range. In the present specification, a "mechanical strength" refers to a mechanical strength including various characteristics such as a wear resistance, a breakage resistance, and a bending strength.

Further, in the present specification, a "nose curvature" refers to a region of a cutting edge portion that is to be directly involved in cutting to be thereby brought into contact with swarf of a workpiece. Specifically, the "nose curvature" refers to a portion of cutting edge portion 3 included in an imaginary semicircle (solid line) shown in FIG. 1. As a radius, this imaginary semicircle has a predetermined distance d extending from an intersection o to each of two facing ridgelines that form a crossing portion at which rake face and flank face of cutting edge portion 3 cross each other, wherein intersection o is an intersection at which imaginary lines (broken lines) obtained by extending the ridgelines cross each other.

The "curvature radius" of the nose curvature refers to a reciprocal of the "curvature" of a curved surface of the nose curvature. Specifically, the curved surface of the nose curvature is given as an arc included in an imaginary circle represented by a broken line shown in FIG. 1, for example. In this case, a radius r of the imaginary circle represented by the broken line is referred to as the "curvature radius" of the nose curvature, and a reciprocal (1/r) thereof is referred to as the "curvature" of the curved surface of the nose curvature. Here, in FIG. 1, curvature radius (the radius of the imaginary circle represented by the broken line) r of the nose curvature and distance d from intersection o to each of the ridgelines are the same in size (d=r).

A "vertex angle" of the nose curvature refers to an angle α formed by the above-described two imaginary lines (broken lines) in FIG. 1. An imaginary cross section that bisects angle α, i.e., the "vertex angle" is referred to as a "bisecting cross section" of the vertex angle of the nose curvature. Further, a "relief angle" refers to an angle formed between a workpiece and the flank face in the cutting edge portion.

It should be noted that when the rake face has a curved surface in cutting edge portion 3, a surface of cutting edge portion 3 at the base material side or an upper surface of the base material is assumed as the rake face and a "direction of a line of intersection" between the rake face and the bisecting cross section of the vertex angle of the nose curvature refers to a direction of a line of intersection between this assumed rake face and the bisecting cross section of the vertex angle of the nose curvature.

In the present specification, a "synthetic single-crystal diamond" is different from a natural diamond and refers to an artificially manufactured diamond such as a single-crystal diamond manufactured by a high pressure and high temperature (HPHT) method, or a single-crystal diamond manufactured by a chemical vapor deposition (CVD) method. Particularly, a "CVD single-crystal diamond" refers to a single-crystal diamond produced by epitaxially growing a diamond single crystal on a diamond single-crystal substrate using the CVD method. A <110> direction of this CVD single-crystal diamond refers to four equivalent crystal orientations including [01-1] of the CVD single-crystal diamond. Specifically, the <110> direction of this CVD single-crystal diamond refers to crystal orientations constituted of [01-1], [0-1-1], [0-11] and [011] of the CVD single-crystal diamond. A <100> direction of the CVD single-crystal diamond refers to four equivalent crystal orientations including [010] of the CVD single-crystal diamond. Specifically, the <100> direction of the CVD single-crystal diamond refers to crystal orientations constituted of [010], [00-1], [0-10] and [001] of the CVD single-crystal diamond. Here, the sign "-" for indication of a crystal orientation is supposed to be provided above a numeral, and is read as "bar". For example, [01-1] is read as "zero, one, one, bar".

<<Turning Tool>>

A turning tool according to the present embodiment is a turning tool used for turning. The turning tool includes: a holder portion; and a cutting edge portion fixed to the holder portion. The cutting edge portion is composed of a synthetic single-crystal diamond. The cutting edge portion includes a rake face, a flank face, and a cutting edge disposed at a crossing portion at which the rake face and the flank face cross each other, and the cutting edge portion has a nose curvature having a curvature radius of more than or equal to 0.1 mm and less than or equal to 1.2 mm. The nose curvature satisfies at least one of: a condition that a direction of a line of intersection between the rake face and a bisecting cross section of a vertex angle of the nose curvature is within ±10° relative to a <110> direction of the synthetic single-crystal diamond; and a condition that the direction of the line of intersection between the rake face and the bisecting cross section of the vertex angle of the nose curvature is within ±10° relative to a <100> direction of the synthetic single-crystal diamond. The turning tool having such a feature has a wear resistance, and can attain a smoothly finished processed surface of a workpiece.

Preferably, the turning is performed under a condition that a feed f is more than or equal to 0.01 mm/rev and less than 0.7 mm/rev. Further, the synthetic single-crystal diamond is preferably a CVD single-crystal diamond. Accordingly, the turning tool has a more sufficient wear resistance, and can attain a smoothly finished processed surface of a workpiece.

Regarding the turning tool according to the present embodiment, for ease of description, the following first describes a turning tool according to a first embodiment in which the direction of the line of intersection between the rake face and the bisecting cross section of the vertex angle of the nose curvature is within ±10° relative to the <110> direction of the synthetic single-crystal diamond. Thereafter, a turning tool according to a second embodiment will be described in which the direction of the line of intersection between the rake face and the bisecting cross section of the vertex angle of the nose curvature is within ±10° relative to the <100> direction of the synthetic single-crystal diamond.

Further, the description below illustratively describes an embodiment in which the turning by the above-described turning tool is performed under a condition that feed f is more than or equal to 0.01 mm/rev and less than 0.7 mm/rev and the synthetic single-crystal diamond is a CVD single-crystal diamond.

First Embodiment

The turning tool according to the first embodiment is a turning tool used for turning. The turning is preferably performed under a condition that feed f is more than or equal to 0.01 mm/rev and less than 0.7 mm/rev. Feed f is determined by a relation with the curvature radius of the cutting edge portion (nose curvature) of the turning tool used for turning. Accordingly, when the turning tool according to the first embodiment is used for turning under the condition that feed f falls within the above-described range, the turning tool has a particularly excellent wear resistance, and can attain a smoothly finished processed surface of a workpiece. In the present embodiment, when the turning tool is used for turning under a condition that feed f is less than 0.01 mm/rev, a processing time becomes remarkably long. Hence, this tends to be unrealistic. In the present embodiment, when the turning tool is used for turning under a condition that feed f is more than or equal to 0.7 mm/rev, the cutting edge is likely to be broken and it tends to be difficult to attain a smoothly finished processed surface of a workpiece.

Figure 2:
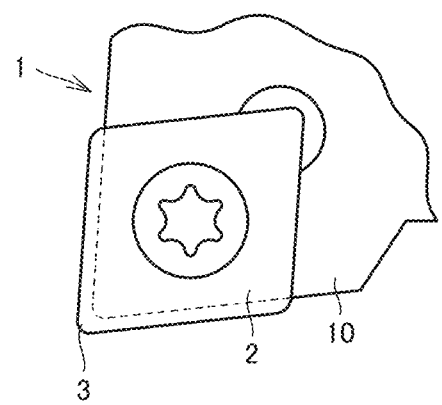
FIG. 2 is an enlarged plan view showing the cutting edge portion and a holder portion when viewed in a plan view in the turning tool according to one embodiment of the present disclosure.

As shown in FIG. 2, a turning tool 1 includes a holder portion 10 and a cutting edge portion 3 fixed to holder portion 10. A material of holder portion 10 should not be limited particularly; however, holder portion 10 is preferably composed of steel, cemented carbide, or the like, for example. A shape of holder portion 10 should not be limited particularly as long as it can be used for turning. For example, holder portion 10 can have a shape to include a corner for storing a base material 2 shown in FIG. 3. The corner of holder portion 10 is formed by partially depressing a portion of an upper surface of holder portion 10. Cutting edge portion 3 is fixed to the corner of this holder portion 10 with base material 2 being interposed therebetween. Specifically, when base material 2 is provided with a hole, cutting edge portion 3 is fixed to holder portion 10 with base material 2 being interposed therebetween by using a method of clamping into the hole (lever lock method) or a method of screwing into the hole (screw-on method). When base material 2 is provided with no hole, cutting edge portion 3 is fixed to holder portion 10 with base material 2 being interposed therebetween by using clamping means such as a method (clamp-on method) for pressing and holding the upper surface of base material 2. A material of base material 2 should not be limited particularly; however, base material 2 is preferably composed of cemented carbide or the like, for example.

(Cutting Edge Portion)

Figure 3:
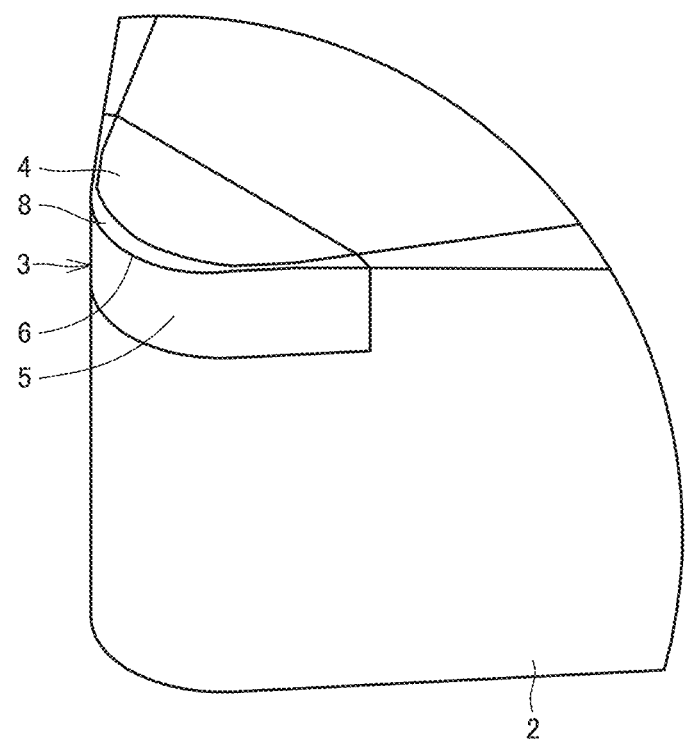
FIG. 3 is an enlarged perspective view showing the cutting edge portion of the turning tool according to one embodiment of the present disclosure.

Cutting edge portion 3 is composed of a synthetic single-crystal diamond. Specifically, in the first embodiment, cutting edge portion 3 is composed of a CVD single-crystal diamond. This CVD single-crystal diamond will be described later. As shown in FIG. 3, cutting edge portion 3 includes a rake face 4, a flank face 5, and a cutting edge 6 disposed at an crossing portion at which rake face 4 and flank face 5 cross each other, and cutting edge portion 3 has a nose curvature having a curvature radius of more than or equal to 0.1 mm and less than or equal to 1.2 mm. Each of rake face 4 and flank face 5 is formed by grinding or polishing the CVD single-crystal diamond. Cutting edge 6 corresponds to a ridgeline serving as the crossing portion at which rake face 4 and flank face 5 cross each other. A chamfer 8 having an unequal width may be disposed at the crossing portion at which rake face 4 and flank face 5 cross each other. In this case, cutting edge 6 is formed on a ridgeline at a position at which flank face 5 and chamfer 8 cross each other. Chamfer 8 can be also formed by grinding or polishing the CVD single-crystal diamond. Rake face 4 of cutting edge portion 3 preferably corresponds to a (100) plane of the CVD single-crystal diamond.

(CVD Single-Crystal Diamond)

As described above, in the first embodiment, cutting edge portion 3 is composed of the CVD single-crystal diamond. The CVD single-crystal diamond can be produced by using the CVD method to epitaxially grow a diamond single crystal on a diamond single-crystal substrate as described below. The synthetic single-crystal diamond preferably includes more than or equal to 1 ppm and less than or equal to 100 ppm of nitrogen atoms. Specifically, in the first embodiment, the CVD single-crystal diamond preferably includes more than or equal to 1 ppm and less than or equal to 100 ppm of nitrogen atoms. When the CVD single-crystal diamond includes the nitrogen atoms in the above-described range, an effect of suppressing progress of chipping is obtained even if a strong stress is applied onto a specific region of cutting edge 6. Hence, a mechanical strength such as a toughness and a hardness can be improved. Accordingly, the turning tool can be also excellent in breakage resistance. The nitrogen atoms exist as an impurity element in the CVD single-crystal diamond. Here, the impurity element refers to an element (different element) other than carbon, which is a main constituting element of the single-crystal diamond.

When the content of the nitrogen atoms in the CVD single-crystal diamond is less than 1 ppm, the effect of suppressing progress of chipping cannot be obtained sufficiently, with the result that the breakage resistance tends to be unable to be improved. When the content of the nitrogen atoms in the CVD single-crystal diamond is more than 100 ppm, crystal defects are increased, with the result that large breakage tends to be likely to occur in cutting edge 6 when a strong stress is applied onto a specific region of cutting edge 6. The content of the nitrogen atoms in the CVD single-crystal diamond is preferably more than or equal to 20 ppm and less than or equal to 80 ppm.

The CVD single-crystal diamond may include impurity elements other than the nitrogen atoms. For example, as the impurity elements other than the nitrogen atoms, the CVD single-crystal diamond may include silicon, boron, hydrogen, and the like. Regarding the impurity elements other than the nitrogen atoms in the CVD single-crystal diamond, more than or equal to 0.01 ppm and less than or equal to 3 ppm of each of silicon and boron may be solely included, more than or equal to 1 ppm and less than or equal to 100 ppm of hydrogen may be solely included, and more than or equal to 1 ppm and less than or equal to 100 ppm of these elements may be included in total.

The contents of the nitrogen atoms and the other impurity elements in the CVD single-crystal diamond can be measured by a secondary ion mass spectrometry (SIMS) method.

(Nose Curvature)

The cutting edge portion has the nose curvature having a curvature radius of more than or equal to 0.1 mm and less than or equal to 1.2 mm as described above. Since the curvature radius of the nose curvature is more than or equal to 0.1 mm and less than or equal to 1.2 mm, a balance becomes excellent between the cutting resistance and the cutting edge strength, thus attaining a smoothly finished processed surface of a workpiece. When the curvature radius of the nose curvature is less than 0.1 mm, cutting edge 6 becomes too acute, with the result that it tends to be difficult to attain a smoothly finished processed surface. When the curvature radius of the nose curvature is more than 1.2 mm, the cutting resistance becomes large, with the result that cutting edge 6 tends to be likely to be broken. The curvature radius of the nose curvature is preferably more than or equal to 0.2 mm and less than or equal to 0.8 mm. The curvature radius of the nose curvature can be measured by way of enlarged projection on a screen with the use of a projector used in tool inspection or the like.

The direction of the line of intersection between rake face 4 and the bisecting cross section of the vertex angle of the nose curvature is within ±10° relative to the <110> direction of the synthetic single-crystal diamond. Particularly, the direction of the line of intersection between rake face 4 and the bisecting cross section of the vertex angle of the nose curvature is preferably within ±5° relative to the <110> direction of the synthetic single-crystal diamond. That is, in the first embodiment, the direction of the line of intersection between rake face 4 and the bisecting cross section of the vertex angle of the nose curvature can be within ±10° relative to the <110> direction of the CVD single-crystal diamond, particularly, the direction of the line of intersection between rake face 4 and the bisecting cross section of the vertex angle of the nose curvature is preferably within ±5° relative to the <110> direction of the CVD single-crystal diamond. Further, the vertex angle of the nose curvature is preferably more than or equal to 55° and less than or equal to 90°. The vertex angle of the nose curvature can be more than or equal to 35° and less than or equal to 90°.

Here, when the turning tool using the CVD single-crystal diamond according to the present disclosure has a surface that corresponds to a (110) plane perpendicular to the <110> direction and that is to be brought into contact with a workpiece, i.e., that is to be worn during cutting, the <100> direction, which corresponds to a direction of wear in the (110) plane, is known as a wear facilitating direction. Therefore, when the direction of the line of intersection between rake face 4 and the bisecting cross section of the vertex angle of the nose curvature is within ±10°, preferably, within ±5° relative to the <110> direction of the CVD single-crystal diamond, a region of cutting edge 6 corresponding to a position at which the depth of cut of the workpiece is maximum tends to be greatly worn by performing cutting under a severe condition involving a large amount of cut (ap) of the workpiece.

On the other hand, in this case, by placing the <100> direction of the CVD single-crystal diamond at the front cutting edge boundary portion of cutting edge 6 serving as a boundary to be brought into contact with the workpiece, the <100> direction, which is a direction (hereinafter, also referred to as "wear resistance direction") comparatively involving a wear resistance with respect to the above-described wear facilitating direction, can be placed in the (100) plane perpendicular to the <100> direction. Particularly, in the above-described case, an off angle does not become large. The off angle refers to an angle at which the <100> direction of the CVD single-crystal diamond of cutting edge 6 and the orientation of the CVD single-crystal diamond at the front cutting edge boundary portion of cutting edge 6 cross each other. Further, when the vertex angle of the nose curvature is more than or equal to 55° and less than or equal to 90°, the <100> direction in the (100) plane of the CVD single-crystal diamond can be placed at the front cutting edge boundary portion of cutting edge 6 with the above-described off angle being smaller. Accordingly, the front cutting edge boundary portion of cutting edge 6 is comparatively less likely to be worn with respect to the above-described wear facilitating direction, advantageously.

The following effect is obtained by placing, at the region of cutting edge 6 corresponding to the position at which the depth of cut of the workpiece is maximum, the <100> direction (the wear facilitating direction) in the (110) plane of the CVD single-crystal diamond and by placing, at the front cutting edge boundary portion, the <100> direction (wear resistance direction) in the (100) plane of the CVD single-crystal diamond. That is, as the turning is progressed, wear is progressed at the region of cutting edge 6 corresponding to the position at which the depth of cut of the workpiece is maximum but wear is hardly progressed at the front cutting edge boundary portion.

That is, as the turning is progressed, an amount of swarf is decreased at the region of cutting edge 6 corresponding to the position at which the depth of cut of the workpiece is maximum, but an amount of swarf is substantially unchanged at the front cutting edge boundary portion.

From a viewpoint of the processed surface of the workpiece, this can be said as follows: as the turning is progressed, a difference in the amount of swarf resulting from cutting becomes smaller between the position at which the depth of cut of the workpiece is maximum and the position of the workpiece corresponding to the front cutting edge boundary portion of cutting edge 6. Accordingly, a surface roughness (Ra) of the processed surface of the workpiece becomes small. Accordingly, the turning tool of the present embodiment can attain a smoothly finished processed surface of a workpiece.

Further, since the <100> direction in the (100) plane of the CVD single-crystal diamond is placed at the front cutting edge boundary portion of cutting edge 6, a flank wear width is less likely to be wide. Accordingly, the wear resistance, which is evaluated in accordance with a magnitude of the flank wear width of the front cutting edge boundary portion, becomes excellent. Hence, the turning tool of the present embodiment can be excellent in wear resistance.

Figure 4:
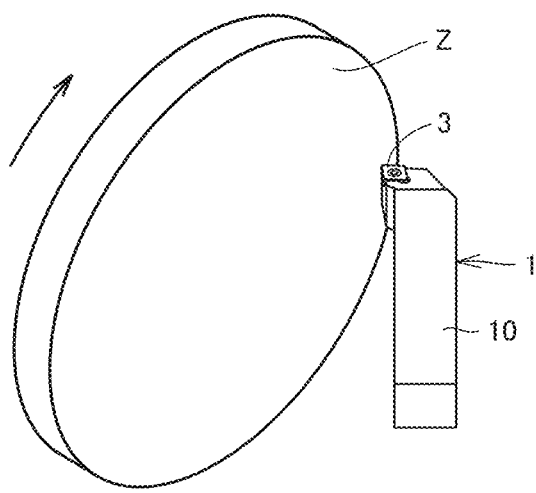
FIG. 4 is an explanatory diagram illustrating a use state of the turning tool according to one embodiment of the present disclosure.

Here, the turning is preferably performed under a condition that the relief angle is more than or equal to 7° and less than or equal to 15°. By performing the turning under the condition that the relief angle falls within the above-described range, even when wear of cutting edge 6 is progressed, contact between the workpiece and the flank face can be reduced as small as possible and a cutting edge strength can be secured. Accordingly, the wear resistance and breakage resistance of the turning tool of the present embodiment are exhibited sufficiently. It should be noted that the turning described above can be performed under a condition that the relief angle is more than or equal to 7° and less than or equal to 20°. Further, for the sake of reference, FIG. 4 shows a use state of turning tool 1 during turning of a workpiece Z.

A crystal orientation of the CVD single-crystal diamond in the direction of the line of intersection between rake face 4 and the bisecting cross section of the vertex angle of the nose curvature can be determined by using a Laue camera method employing X-ray diffraction, for example.

(Function)

As described above, the turning tool according to the first embodiment has a wear resistance, and can attain a smoothly finished processed surface of a workpiece. Particularly, the turning tool according to the first embodiment is suitable for cutting under a severe condition involving a large amount of cut (ap).

Second Embodiment

The following describes a turning tool according to a second embodiment. In the description below, a difference from the turning tool according to the first embodiment will be mainly described while the same description will not be repeated.

In the turning tool according to the second embodiment, the direction of the line of intersection between rake face 4 and the bisecting cross section of the vertex angle of the nose curvature is within ±10° relative to the 100 direction of the synthetic single-crystal diamond. Particularly, the direction of the line of intersection between rake face 4 and the bisecting cross section of the vertex angle of the nose curvature is preferably within ±5° relative to the <100> direction of the synthetic single-crystal diamond. That is, in the second embodiment, the direction of the line of intersection between rake face 4 and the bisecting cross section of the vertex angle of the nose curvature can be within ±10° relative to the <100> direction of the CVD single-crystal diamond, particularly, the direction of the line of intersection between rake face 4 and the bisecting cross section of the vertex angle of the nose curvature is preferably within ±5° relative to the <100> direction of the CVD single-crystal diamond. As with the turning tool according to the first embodiment, the vertex angle of the nose curvature is preferably more than or equal to 55° and less than or equal to 90°. As with the first embodiment, the turning using the turning tool according to the second embodiment is also preferably performed under a condition that the relief angle is more than or equal to 7° and less than or equal to 15°. Also in the second embodiment, the vertex angle of the nose curvature can be more than or equal to 35° and less than or equal to 90° and the turning can be performed under a condition that the relief angle is more than or equal to 7° and less than or equal to 20°.

The <100> direction of the CVD single-crystal diamond is the wear resistance direction as described above. That is, it has been known that when a surface corresponding to the (100) plane perpendicular to the <100> direction of the CVD single-crystal diamond is a surface to be brought into contact with a workpiece (a surface to be worn during cutting), the <100> direction in the (100) plane serves as the wear resistance direction. Therefore, when the direction of the line of intersection between rake face 4 and the bisecting cross section of the vertex angle of the nose curvature is within ±10°, preferably, within ±5° relative to the <100> direction of the CVD single-crystal diamond, wear is less likely to be progressed at the region of cutting edge 6 corresponding to the position at which the depth of cut in the workpiece is maximum.

In this case, when the cutting involves a small amount of cut (ap), an orientation close to the <100> direction (wear resistance direction) of the CVD single-crystal diamond can be placed also at the front cutting edge boundary portion serving as a boundary to be brought into contact with the workpiece. Hence, the turning tool of the present embodiment can have a wear resistance. Further, when the cutting involves a small amount of cut (ap), a small surface roughness (Ra) of the processed surface of the workpiece can be attained. Accordingly, the turning tool of the present embodiment can attain a more smoothly finished processed surface of a workpiece.

(Function)

As described above, the turning tool according to the second embodiment has a wear resistance, and can attain a smoothly finished processed surface of a workpiece. Particularly, the turning tool according to the second embodiment is suitable for cutting under a condition involving a small amount of cut (ap).

<Method of Manufacturing Turning Tool (Cutting Edge Portion)>

The turning tool according to the present embodiment can be manufactured by appropriately using a conventionally known method. Accordingly, the method of manufacturing the above-described turning tool should not be limited particularly. However, for example, it is preferable to use the following method in order to manufacture a cutting edge portion composed of the CVD single-crystal diamond in the above-described turning tool.

That is, an exemplary method of manufacturing the above-described cutting edge portion is as follows: A method of manufacturing a cutting edge portion, the method comprising: a first step of preparing a single-crystal substrate composed of a diamond; a second step of forming a conductive layer on a surface of the single-crystal substrate by implanting ions into the single-crystal substrate; a third step of epitaxially growing a growth layer composed of a diamond on the conductive layer; a fourth step of separating the growth layer from the single-crystal substrate; and a fifth step of obtaining a cutting edge portion composed of a CVD single-crystal diamond by grinding or polishing the separated growth layer.

(First Step)

First, in the first step, the single-crystal substrate composed of a diamond is prepared. For the single-crystal substrate composed of a diamond, a conventionally known single-crystal substrate can be used. For example, the above-described single-crystal substrate can be prepared by using a single-crystal substrate (type: Ib) that has a flat plate shape and that is composed of a diamond manufactured by the high pressure and high temperature method.

The above-described single-crystal substrate is a flat plate that has: a surface constituted of the (100) plane of the single-crystal diamond; and a side surface constituted of the (001) plane and (011) plane perpendicular to the surface. For the single-crystal substrate, a variation in the thickness of the flat plate is preferably less than or equal to 10%. Further, the surface of the single-crystal substrate preferably has a surface roughness (Ra) of less than or equal to 30 nm. The shape of the surface (upper surface) of the single-crystal substrate may be a quadrangular shape such as a square or a rectangle, or a polygonal shape other than the quadrangular shape such as a hexagon or an octagon, for example.

Further, it is preferable to perform etching onto a surface of the above-described single-crystal substrate. For example, the surface of the above-described single-crystal substrate is etched by reactive ion etching (RIE) using oxygen ($O_2$) gas and carbon tetrafluoride ($CF_4$) gas. The etching method should not be limited to the RIE, and may be sputtering by gas mainly constituted of argon (Ar) gas, for example.

(Second Step)

In the second step, the conductive layer is formed on the surface of the single-crystal substrate by implanting ions into the single-crystal substrate. Specifically, carbon (C) ions are implanted into the above-described etched surface of the single-crystal substrate. Accordingly, the conductive layer can be formed at a region including the surface of the single-crystal substrate. The implanted ions should not be limited to the carbon ions, and may be nitrogen ions, silicon ions, phosphorous ions, or sulfur ions.

(Third Step)

In the third step, the growth layer composed of a diamond is epitaxially grown on the conductive layer. Specifically, the single-crystal substrate having the above-described conductive layer formed thereon is placed in a CVD furnace having an atmosphere formed by introducing hydrogen ($H_2$) gas, methane ($CH_4$) gas, and nitrogen ($N_2$) gas, and a microwave plasma CVD method is performed in the CVD furnace. Accordingly, a single-crystal diamond is epitaxially grown thereon with the conductive layer being interposed therebetween, whereby the growth layer composed of a diamond can be formed on the conductive layer. The method of forming the growth layer should not be limited to the microwave plasma CVD method, and a hot-filament CVD method, a DC plasma method, or the like can be used, for example. By adjusting the amount of nitrogen ($N_2$) gas in the atmosphere in the CVD furnace, the content of the nitrogen atoms in the CVD single-crystal diamond can be determined.

Further, for the atmosphere in the CVD furnace, different gas including hydrocarbon, such as ethane gas, can be used instead of the methane gas. The surface of the single-crystal substrate for forming the growth layer preferably corresponds to the (100) plane, and more preferably corresponds to a plane having an off angle of more than or equal to 0.5° and less than or equal to 0.7° relative to the (100) plane.

(Fourth Step)

In the fourth step, the growth layer is separated from the single-crystal substrate. Specifically, by performing electrochemical etching to the conductive layer in the single-crystal substrate, the single-crystal substrate and the growth layer can be separated from each other. Accordingly, the CVD single-crystal diamond (growth layer) can be obtained. The method of separating the growth layer should not be limited to the electrochemical etching described above, and may be slicing using a laser, for example.

(Fifth Step)

In the fifth step, the cutting edge portion composed of the CVD single-crystal diamond is obtained by grinding or polishing the separated growth layer. Specifically, by performing conventionally known grinding or polishing onto the above-described CVD single-crystal diamond (growth layer), it is possible to obtain a cutting edge portion including: a rake face; a flank face; and a cutting edge disposed at a crossing portion at which the rake face and the flank face cross each other. On this occasion, the cutting edge portion is ground or polished to have a nose curvature having a curvature radius of more than or equal to 0.1 mm and less than or equal to 1.2 mm. Also, the nose curvature is formed to satisfy at least one of a condition that a direction of a line of intersection between the rake face and a bisecting cross section of a vertex angle of the nose curvature is within ±10° relative to a <110> direction of the CVD single-crystal diamond, and a condition that the direction of the line of intersection between the rake face and the bisecting cross section of the vertex angle of the nose curvature is within ±10° relative to a <100> direction of the CVD single-crystal diamond.

In this way, the cutting edge portion composed of the CVD single-crystal diamond in the present embodiment can be manufactured. The turning tool according to the present embodiment can be manufactured by using known clamping means to fix the cutting edge portion to the corner of the holder portion with the base material being interposed therebetween, for example.

CLAUSES

The above description includes embodiments additionally described below.

(Clause 1)

A turning tool used for turning under a condition that a feed f is more than or equal to 0.01 mm/rev and less than 0.7 mm/rev, the turning tool comprising: a holder portion; and a cutting edge portion fixed to the holder portion, wherein
the cutting edge portion is composed of a CVD single-crystal diamond,
the cutting edge portion includes a rake face, a flank face, and a cutting edge disposed at a crossing portion at which the rake face and the flank face cross each other, and the cutting edge portion has a nose curvature having a curvature radius of more than or equal to 0.1 mm and less than or equal to 1.2 mm, and
a direction of a line of intersection between the rake face and a bisecting cross section of a vertex angle of the nose curvature is within ±10° relative to a <110> direction of the CVD single-crystal diamond or is within ±10° relative to a <100> direction of the CVD single-crystal diamond.

(Clause 2)

The turning tool according to clause 1, wherein the direction of the line of intersection is within ±5° relative to the <110> direction of the CVD single-crystal diamond.

(Clause 3)

The turning tool according to clause 1, wherein the direction of the line of intersection is within ±5° relative to the <100> direction of the CVD single-crystal diamond.

(Clause 4)

The turning tool according to any one of clause 1 to clause 3, wherein the CVD single-crystal diamond includes more than or equal to 1 ppm and less than or equal to 100 ppm of nitrogen atoms.

(Clause 5)

The turning tool according to any one of clause 1 to clause 4, wherein the vertex angle is more than or equal to 55° and less than or equal to 90°.

(Clause 6)

The turning tool according to any one of clause 1 to clause 5, wherein the turning is performed under a condition that a relief angle is more than or equal to 7° and less than or equal to 15°.

EXAMPLES

While the present disclosure will be described in more detail hereinafter with reference to Examples, the present disclosure is not limited thereto.

Example 1

<Production of Cutting Edge Portion Composed of CVD Single-Crystal Diamond>

By using the above-described method of manufacturing the cutting edge portion, a cutting edge portion composed of a CVD single-crystal diamond was manufactured. In an Example 1, for a cutting test described later, a total of 26 cutting edge portions of samples 1-1 to 1-21 and samples 1-A to 1-E shown in Table 1 were produced.

First, 26 single-crystal substrates were prepared, each of which had a thickness of 0.7 mm and had a distance (width) of 5 mm between side surfaces thereof. A surface of each of these single-crystal substrates was etched from the surface to a depth region of 0.3 μm by RIE (first step).

Next, carbon ions were implanted with an energy of 3 MeV and a dose amount of $3.0 \times 10^{16}/cm^2$, cm, thereby forming a conductive layer on the surface of the single-crystal substrate (second step). Further, the microwave plasma CVD method was performed to epitaxially grow, on the conductive layer of the single-crystal substrate, a growth layer composed of a diamond having a thickness of 0.7 mm (third step). On this occasion, as the atmosphere in the CVD furnace, hydrogen gas, methane gas, and nitrogen gas were used. The concentration of the methane gas with respect to the hydrogen gas was 10 volume % and the concentration of the nitrogen gas with respect to the methane gas was 1 volume %. Further, a pressure in the CVD furnace was set to 10 kPa, and a substrate temperature was set to 900° C.

Next, by performing electrochemical etching onto the conductive layer in the above-described single-crystal substrate, the growth layer (CVD single-crystal diamond) was separated from the single-crystal substrate (fourth step). The content of the nitrogen atoms in the above-described growth layer (CVD single-crystal diamond) was 50 ppm when measured by SIMS. Further, the above-described Laue camera method was used to specify crystal plane and crystal direction of the growth layer (CVD single-crystal diamond).

Finally, by appropriately grinding and polishing the growth layer (CVD single-crystal diamond), a cutting edge portion was obtained which included: a rake face; a flank face; and a cutting edge disposed at a crossing portion at which the rake face and the flank face crossed each other (fifth step). In the grinding and polishing, the curvature radius of the nose curvature of each of the cutting edge portions of samples 1-1 to 1-21 and samples 1-A to 1-E was as shown in Table 1. Also, an angle at which the direction of the line of intersection between the rake face and the bisecting cross section of the vertex angle of the nose curvature and the <110> direction of the CVD single-crystal diamond in the above-described cutting edge portion cross each other was as shown in the "Off Angle" of Table 1.

That is, the column "Off Angle" in Table 1 shows an angle at which the direction of the line of intersection between the rake face and the bisecting cross section of the vertex angle of the nose curvature and the <110> direction of the CVD single-crystal diamond cross each other. Further, in Table 1, a unit of the "curvature radius" of the nose curvature is mm. The vertex angle of the nose curvature was 60° in each of the cutting edge portions of samples 1-1 to 1-21 and samples 1-A to 1-E.

<Production of Turning Tool>

The cutting edge portion was fixed using the screw-on method to a holder portion (material: cemented carbide) with a base material being interposed therebetween. In this way, each of the turning tools of samples 1-1 to 1-21 and samples 1-A to 1-E was produced. The turning tools of samples 1-1 to 1-21 correspond to Examples of the present disclosure, whereas the turning tools of samples 1-A to 1-E correspond to Comparative Examples.

<Cutting Test>

The following cutting test was performed by using each of the turning tools of samples 1-1 to 1-21 and samples 1-A to 1-E. Specifically, the turning tool was attached to a turret of an NC lathe. On the other hand, a workpiece having a cylindrical shape was fixed to a chuck of the NC lathe, and was subjected to turning under the following cutting conditions. In this turning, a relief angle was set to 7°.

(Cutting Conditions)

Workpiece: aluminum alloy ADC12 (four intermittent grooves)

Cutting speed (Vc): 200 in/minute

Amount of cut (ap): 0.3 mm

Feed (0: changed in a range of 0.005 to 0.7 mm/rev (see Table 1).

Material of cutting oil: 2 mass % of water-soluble emulsion.

<Evaluation>

(Surface Roughness (Ra))

For each of the turning tools of samples 1-1 to 1-21 and samples 1-A to 1-E, surface roughnesses (Ra) of the workpiece at respective points of time at which a cutting distance became 1 km, 30 km, and 60 km as a result of the above-described turning were measured. The surface roughnesses (Ra) are determined in accordance with JIS B 0601: 2001 using a surface roughness measurement device. Results thereof are shown in the column "Surface Roughness [Ra]" of Table 1. The sign "-" in the column "Surface Roughness [Ra]" indicates that there was no value because cutting could not be completed due to breakage of the cutting edge. It is understood that as a numerical value shown in the column "Surface Roughness [Ra]" is smaller, a corresponding sample can attain a more smoothly finished processed surface of the workpiece.

(Flank Wear Width of Region of Cutting Edge Corresponding to Position at which Depth of Cut of Workpiece was Maximum)

For each of the turning tools of samples 1-1 to 1-21 and samples 1-A to 1-E, flank wear widths at the region of the cutting edge corresponding to the position at which the depth of cut of the workpiece was maximum were measured at respective points of time at which the cutting distance reached 1 km, 30 km, and 60 km as a result of the above-described turning. Results thereof are shown in the column "Flank Wear Width (Point with Maximum Depth of Cut)" of Table 1. A unit of the numerical value in the column "Flank Wear Width (Point with Maximum Depth of Cut)" is mm. Further, the description "Breakage" in this column indicates that the above-described turning was aborted due to occurrence of breakage, such as chipping, in the region of the cutting edge corresponding to the position at which the depth of cut of the workpiece was maximum. It is understood that as a numerical value shown in the column "Flank Wear Width (Point with Maximum Depth of Cut)" is smaller, a corresponding sample is more excellent in wear resistance at the region of the cutting edge corresponding to the position at which the depth of cut of the workpiece was maximum.

(Flank Wear Width at Front Cutting Edge Boundary Portion)

For each of the turning tools of samples 1-1 to 1-21 and samples 1-A to 1-E, flank wear widths at the front cutting edge boundary portion of the cutting edge were measured at respective points of time at which the cutting distance reached 1 km, 30 km, and 60 km as a result of the above-described turning. Results thereof are shown in the column "Flank Wear Width (Front Cutting Edge Boundary Portion)" of Table 1. A unit of a numerical value in the column "Flank Wear Width (Front Cutting Edge Boundary Portion)" is mm. Further, the description "Breakage" in this column indicates that the above-described turning was aborted due to occurrence of breakage, such as chipping, in the front cutting edge boundary portion of the cutting edge. It is understood that as a numerical value shown in the column "Flank Wear Width (Front Cutting Edge Boundary Portion)" is smaller, a corresponding sample is excellent in wear resistance at the front cutting edge boundary portion of the cutting edge.

(Burr Formation Distance)

A cutting distance (km) of each of the turning tools of samples 1-1 to 1-21 and samples 1-A to 1-E was measured at a point of time at which a burr (having a height of 0.1 mm) was formed when retreating from an intermittent portion in the turning. Results thereof are shown in the column "Formation of Burr" in Table 1. The sign "-" in the column "Formation of Burr" indicates that no burr having a height of more than or equal to 0.1 mm was formed at a point of time at which the cutting distance became more than 60 km. It is understood that as a numerical value shown in the column "Formation of Burr" is larger, a corresponding sample can attain a more smoothly finished processed surface of the workpiece. It is also understood that a sample for which the sign "-" is described in the column "Formation of Burr" can attain a smoothly finished processed surface of the workpiece.

TABLE 1

| | Curvature Radius | Feed (f) | Off Angle | Surface Roughness [Ra] | | | Flank Wear Width (Point with Maximum Depth of Cut) |
|---|---|---|---|---|---|---|---|
| | | | | 1 km | 30 km | 60 km | 1 km |
| Sample 1-1 | 0.1 | 0.01 | 0 | 0.033 | 0.02 | 0.007 | 1.059 |
| Sample 1-2 | 0.1 | 0.01 | 5 | 0.035 | 0.023 | 0.01 | 0.977 |
| Sample 1-3 | 0.1 | 0.01 | 10 | 0.038 | 0.026 | 0.013 | 0.814 |
| Sample 1-4 | 0.1 | 0.2 | 0 | 11.5 | 10.74 | 9.78 | 2.036 |
| Sample 1-5 | 0.1 | 0.2 | 5 | 11.55 | 10.912 | 10.103 | 1.873 |
| Sample 1-6 | 0.1 | 0.2 | 10 | 11.7 | 11.169 | 10.508 | 1.629 |
| Sample 1-7 | 0.4 | 0.01 | 0 | 0.008 | 0.008 | 0.008 | 0.326 |
| Sample 1-8 | 0.4 | 0.01 | 5 | 0.008 | 0.008 | 0.008 | 0.326 |
| Sample 1-9 | 0.4 | 0.01 | 10 | 0.008 | 0.008 | 0.008 | 0.244 |
| Sample 1-10 | 0.4 | 0.4 | 0 | 12.1 | 11.603 | 10.993 | 1.629 |
| Sample 1-11 | 0.4 | 0.4 | 5 | 12.11 | 11.667 | 11.114 | 1.466 |
| Sample 1-12 | 0.4 | 0.4 | 10 | 12.12 | 11.722 | 11.234 | 1.303 |
| Sample 1-13 | 1.2 | 0.01 | 0 | 0.004 | 0.004 | 0.004 | 0.244 |
| Sample 1-14 | 1.2 | 0.01 | 5 | 0.004 | 0.004 | 0.004 | 0.244 |
| Sample 1-15 | 1.2 | 0.01 | 10 | 0.004 | 0.004 | 0.004 | 0.163 |
| Sample 1-16 | 1.2 | 0.3 | 0 | 2.5 | 2.282 | 2.01 | 1.466 |
| Sample 1-17 | 1.2 | 0.3 | 5 | 2.51 | 2.294 | 2.023 | 1.385 |
| Sample 1-18 | 1.2 | 0.3 | 10 | 2.52 | 2.305 | 2.036 | 1.303 |
| Sample 1-19 | 1.2 | 0.69 | 0 | 14.3 | 13.309 | 12.05 | 3.258 |
| Sample 1-20 | 1.2 | 0.69 | 5 | 14.33 | 13.448 | 12.391 | 3.013 |
| Sample 1-21 | 1.2 | 0.69 | 10 | 14.36 | 13.633 | 12.57 | 2.769 |
| Sample 1-A | 0.05 | 0.01 | 0 | 21 | — | — | Breakage |
| Sample 1-B | 1.3 | 0.3 | 0 | 19 | — | — | Breakage |
| Sample 1-C | 0.1 | 0.005 | 0 | 18 | 19 | 21 | 2.021 |
| Sample 1-D | 1.2 | 0.7 | 0 | 19 | — | — | Breakage |
| Sample 1-E | 0.4 | 0.4 | 12 | 21 | 20.305 | 19.237 | 2.851 |

| | Flank Wear Width (Point with Maximum Depth of Cut) | | Flank Wear Width (Front Cutting Edge Boundary Portion) | | | Formation of Burr |
|---|---|---|---|---|---|---|
| | 30 km | 60 km | 1 km | 30 km | 60 km | |
| Sample 1-1 | 5.131 | 10.18 | 0.977 | 4.968 | 9.936 | 54 km |
| Sample 1-2 | 4.642 | 9.203 | 0.896 | 4.479 | 8.959 | 60 km |
| Sample 1-3 | 4.072 | 8.144 | 0.733 | 3.909 | 7.9 | — |
| Sample 1-4 | 10.18 | 20.361 | 0.652 | 3.421 | 6.76 | 26 km |
| Sample 1-5 | 9.203 | 18.325 | 0.652 | 3.665 | 7.248 | 30 km |
| Sample 1-6 | 8.144 | 16.289 | 0.733 | 3.828 | 7.737 | 33 km |
| Sample 1-7 | 1.629 | 3.258 | 0.326 | 1.629 | 3.258 | — |
| Sample 1-8 | 1.466 | 2.932 | 0.326 | 1.466 | 2.932 | — |
| Sample 1-9 | 1.303 | 2.606 | 0.244 | 1.303 | 2.606 | — |
| Sample 1-10 | 8.144 | 16.289 | 0.814 | 3.665 | 7.33 | 34 km |
| Sample 1-11 | 7.33 | 14.66 | 0.733 | 3.339 | 6.597 | 37 km |
| Sample 1-12 | 6.515 | 13.031 | 0.652 | 2.932 | 5.864 | 42 km |

TABLE 1-continued

|  |  |  |  |  |  |  |
|---|---|---|---|---|---|---|
| Sample 1-13 | 1.14 | 2.443 | 0.244 | 1.14 | 2.443 | — |
| Sample 1-14 | 0.977 | 2.28 | 0.244 | 0.977 | 2.28 | — |
| Sample 1-15 | 0.896 | 2.118 | 0.163 | 0.896 | 2.118 | — |
| Sample 1-16 | 7.33 | 14.66 | 1.059 | 5.294 | 10.588 | 37 km |
| Sample 1-17 | 6.923 | 13.845 | 0.977 | 4.887 | 9.773 | 40 km |
| Sample 1-18 | 6.515 | 13.031 | 0.896 | 4.479 | 8.959 | 42 km |
| Sample 1-19 | 16.533 | 33.392 | 1.466 | 7.819 | 15.881 | 14 km |
| Sample 1-20 | 15.067 | 29.075 | 1.222 | 7.167 | 13.764 | 16 km |
| Sample 1-21 | 12.624 | 26.958 | 1.059 | 5.864 | 12.878 | 20 km |
| Sample 1-A | Breakage | Breakage | Breakage | Breakage | Breakage | 0.5 km |
| Sample 1-B | Breakage | Breakage | Breakage | Breakage | Breakage | 0.2 km |
| Sample 1-C | 10.357 | 20.746 | 1.801 | 4.871 | 9.943 | 0.0 km |
| Sample 1-D | Breakage | Breakage | Breakage | Breakage | Breakage | 0.8 km |
| Sample 1-E | 14.253 | 28.505 | 1.425 | 6.414 | 12.827 | 26 km |

According to Table 1, it is understood that the value of the surface roughness (Ra) of the workpiece by each of the turning tools of samples 1-1 to 1-21 is smaller than that by each of the turning tools of samples 1-A to 1-E. That is, each of the turning tools of samples 1-1 to 1-21 can attain a smoothly finished processed surface of the workpiece. Further, in view of the value of the flank wear width at the region of the cutting edge corresponding to the position at which the depth of cut of the workpiece is maximum as well as the value of the flank wear width at the front cutting edge boundary portion, it is understood that each of the turning tools of samples 1-1 to 1-21 has a wear resistance allowing for turning under a severe condition.

Example 2

<Production of Cutting Edge Portion Composed of CVD Single-Crystal Diamond>

By using the same method as that in the above-described Example 1, a cutting edge portion composed of a CVD single-crystal diamond was manufactured. In an Example 2, for a cutting test described later, a total of 26 cutting edge portions of samples 2-1 to 2-21 and samples 2-A to 2-E shown in Table 1 were produced.

However, in Example 2, for each of the cutting edge portions of samples 2-1 to 2-21 and samples 2-A to 2-E, in grinding and polishing the growth layer (CVD single-crystal diamond) to obtain the cutting edge portion, the curvature radius of the nose curvature was as shown in Table 2. Also, an angle at which the direction of the line of intersection between the rake face and the bisecting cross section of the vertex angle of the nose curvature and the <100> direction of the CVD single-crystal diamond in the above-described cutting edge portion crossed each other was as shown in the "Off Angle" of Table 2.

That is, the column "Off Angle" in Table 2 shows an angle at which the direction of the line of intersection between the rake face and the bisecting cross section of the vertex angle of the nose curvature and the <100> direction of the CVD single-crystal diamond cross each other. Further, in Table 2, a unit of the "curvature radius" of the nose curvature is mm. The vertex angle of the nose curvature was 60° in each of the cutting edge portions of samples 2-1 to 2-21 and samples 2-A to 2-E.

<Production of Turning Tool>

By using the same method as that in the above-described Example 1, each of the turning tools of samples 2-1 to 2-21 and samples 2-A to 2-E was produced. The turning tools of samples 2-1 to 2-21 correspond to Examples of the present disclosure, whereas the turning tools of samples 2-A to 2-E correspond to Comparative Examples.

<Cutting Test>

The same cutting test as that in Example 1 was performed onto each of the turning tools of samples 2-1 to 2-21 and samples 2-A to 2-E. Evaluations thereof were also made in the same manner as in Example 1. Results thereof are shown in Table 2.

TABLE 2

|  | Curvature Radius | Feed (f) | Off Angle | Surface Roughness [Ra] | | | Flank Wear Width (Point with Maximum Depth of Cut) |
|---|---|---|---|---|---|---|---|
|  |  |  |  | 1 km | 30 km | 60 km | 1 km |
| Sample 2-1 | 0.1 | 0.01 | 0 | 0.041 | 0.06 | 0.069 | 0.326 |
| Sample 2-2 | 0.1 | 0.01 | 5 | 0.045 | 0.044 | 0.082 | 0.407 |
| Sample 2-3 | 0.1 | 0.01 | 10 | 0.047 | 0.045 | 0.073 | 0.57 |
| Sample 2-4 | 0.1 | 0.2 | 0 | 11.3 | 11.819 | 12.503 | 0.489 |
| Sample 2-5 | 0.1 | 0.2 | 5 | 11.28 | 11.633 | 12.147 | 0.652 |
| Sample 2-6 | 0.1 | 0.2 | 10 | 11.25 | 11.464 | 11.845 | 0.733 |
| Sample 2-7 | 0.4 | 0.01 | 0 | 0.006 | 0.006 | 0.006 | 0.163 |
| Sample 2-8 | 0.4 | 0.01 | 5 | 0.006 | 0.006 | 0.006 | 0.244 |
| Sample 2-9 | 0.4 | 0.01 | 10 | 0.006 | 0.006 | 0.006 | 0.326 |
| Sample 2-10 | 0.4 | 0.4 | 0 | 11.4 | 12.166 | 13.138 | 0.407 |
| Sample 2-11 | 0.4 | 0.4 | 5 | 11.39 | 12.049 | 12.922 | 0.489 |
| Sample 2-12 | 0.4 | 0.4 | 10 | 11.38 | 11.933 | 12.653 | 0.57 |
| Sample 2-13 | 1.2 | 0.01 | 0 | 0.004 | 0.004 | 0.004 | 0.244 |
| Sample 2-14 | 1.2 | 0.01 | 5 | 0.004 | 0.004 | 0.004 | 0.244 |
| Sample 2-15 | 1.2 | 0.01 | 10 | 0.004 | 0.004 | 0.004 | 0.326 |
| Sample 2-16 | 1.2 | 0.3 | 0 | 2.71 | 3.395 | 4.223 | 0.652 |
| Sample 2-17 | 1.2 | 0.3 | 5 | 2.74 | 3.51 | 4.178 | 0.814 |
| Sample 2-18 | 1.2 | 0.3 | 10 | 2.76 | 3.577 | 4.292 | 0.977 |
| Sample 2-19 | 1.2 | 0.69 | 0 | 14.75 | 15.816 | 16.963 | 1.059 |

TABLE 2-continued

| Sample | | | | | | | |
|---|---|---|---|---|---|---|---|
| Sample 2-20 | 1.2 | 0.69 | 5 | 14.78 | 15.971 | 17.083 | 1.222 |
| Sample 2-21 | 1.2 | 0.69 | 10 | 14.81 | 16.161 | 17.143 | 1.385 |
| Sample 2-A | 0.05 | 0.01 | 0 | 25 | — | — | Breakage |
| Sample 2-B | 1.3 | 0.3 | 0 | 23 | — | — | Breakage |
| Sample 2-C | 0.1 | 0.005 | 0 | 22 | 25 | 28 | 0.512 |
| Sample 2-D | 1.2 | 0.7 | 0 | 24 | — | — | Breakage |
| Sample 2-E | 0.4 | 0.4 | 12 | 26 | 26.36 | 28.465 | 0.882 |

| | Flank Wear Width (Point with Maximum Depth of Cut) | | Flank Wear Width (Front Cutting Edge Boundary Portion) | | | Formation of Burr |
|---|---|---|---|---|---|---|
| | 30 km | 60 km | 1 km | 30 km | 60 km | |
| Sample 2-1 | 1.629 | 3.339 | 0.407 | 1.873 | 3.665 | — |
| Sample 2-2 | 2.118 | 4.479 | 0.57 | 2.28 | 4.968 | — |
| Sample 2-3 | 3.095 | 5.945 | 0.652 | 3.176 | 6.271 | — |
| Sample 2-4 | 3.176 | 6.353 | 2.525 | 12.298 | 24.677 | 21 km |
| Sample 2-5 | 4.398 | 8.389 | 2.28 | 11.646 | 23.211 | 22 km |
| Sample 2-6 | 4.805 | 9.366 | 2.036 | 10.262 | 21.094 | 26 km |
| Sample 2-7 | 0.407 | 0.814 | 0.163 | 0.407 | 0.814 | — |
| Sample 2-8 | 0.489 | 1.059 | 0.244 | 0.489 | 1.059 | — |
| Sample 2-9 | 0.57 | 1.222 | 0.326 | 0.57 | 1.222 | — |
| Sample 2-10 | 2.28 | 4.805 | 2.28 | 11.646 | 23.7 | 22 km |
| Sample 2-11 | 2.525 | 5.294 | 2.118 | 10.669 | 22.071 | 25 km |
| Sample 2-12 | 2.769 | 5.864 | 1.873 | 9.61 | 19.954 | 28 km |
| Sample 2-13 | 0.977 | 2.036 | 0.244 | 0.977 | 2.036 | — |
| Sample 2-14 | 1.059 | 2.199 | 0.244 | 1.059 | 2.199 | — |
| Sample 2-15 | 1.14 | 2.851 | 0.326 | 1.14 | 2.851 | — |
| Sample 2-16 | 3.095 | 6.19 | 1.547 | 9.855 | 20.035 | 27 km |
| Sample 2-17 | 3.828 | 7.981 | 1.873 | 11.483 | 21.42 | 23 km |
| Sample 2-18 | 4.316 | 8.796 | 2.118 | 12.461 | 23.13 | 20 km |
| Sample 2-19 | 5.049 | 9.855 | 3.339 | 18.813 | 36.079 | 12 km |
| Sample 2-20 | 5.864 | 11.483 | 3.584 | 21.094 | 39.011 | 10 km |
| Sample 2-21 | 6.597 | 13.275 | 3.991 | 23.781 | 41.699 | 8 km |
| Sample 2-A | Breakage | Breakage | Breakage | Breakage | Breakage | 0.4 km |
| Sample 2-B | Breakage | Breakage | Breakage | Breakage | Breakage | 0.1 km |
| Sample 2-C | 2.108 | 4.871 | 0.815 | 3.931 | 7.548 | 0.0 km |
| Sample 2-D | Breakage | Breakage | Breakage | Breakage | Breakage | 0.6 km |
| Sample 2-E | 4.941 | 10.411 | 4.941 | 25.234 | 51.35 | 7 km |

According to Table 2, it is understood that the value of the surface roughness (Ra) of the workpiece by each of the turning tools of samples 2-1 to 2-21 is smaller than that by each of the turning tools of samples 2-A to 2-E. That is, each of the turning tools of samples 2-1 to 2-21 can attain a smoothly finished processed surface of the workpiece. Further, in view of the value of the flank wear width at the region of the cutting edge corresponding to the position at which the depth of cut of the workpiece is maximum as well as the value of the flank wear width at the front cutting edge boundary portion, it is understood that each of the turning tools of samples 2-1 to 2-21 has a wear resistance allowing for turning under a severe condition.

Example 3

<Production of Cutting Edge Portion Composed of CVD Single-Crystal Diamond>

By using the same method as that in Example 1, a cutting edge portion composed of a CVD single-crystal diamond was manufactured. In an Example 3, for a cutting test described later, a total of 8 cutting edge portions of samples 3-1 to 3-8 were produced.

However, in Example 3, the content of the nitrogen atoms in each of the cutting edge portions (CVD single-crystal diamonds) of samples 3-1 to 3-8 was as shown in Table 3 by adjusting the nitrogen ($N_2$) gas in the atmosphere when performing the microwave plasma CVD method. The content of the nitrogen atoms was measured by SIMS.

Also, for each of the cutting edge portions of samples 3-1 and 3-2 and samples 3-5 and 3-6, in grinding and polishing the growth layer (CVD single-crystal diamond) to obtain the cutting edge portion, the direction of the line of intersection between the rake face and the bisecting cross section of the vertex angle of the nose curvature was matched to the <110> direction of the CVD single-crystal diamond (the off angle was) 0°. For each of the cutting edge portions of samples 3-3 and 3-4 and samples 3-7 and 3-8, the direction of the line of intersection between the rake face and the bisecting cross section of the vertex angle of the nose curvature was matched to the <100> direction of the CVD single-crystal diamond (the off angle was 0°). The above-described Laue camera method was used to specify the crystal direction of the CVD single-crystal diamond. Furthermore, for each of the cutting edge portions of samples 3-1 to 3-8, the vertex angle of the nose curvature was 60°.

<Production of Turning Tool>

By using the same method as that in Example 1, turning tools of samples 3-1 to 3-8 were produced.

<Cutting Test>

Each of the turning tools of samples 3-1 to 3-8 was subjected to a cutting test to evaluate a breakage resistance. Specifically, the turning tool was attached to a turret of an NC lathe. On the other hand, a workpiece having a cylindrical shape was fixed to a chuck of the NC lathe, and was subjected to turning under the following cutting conditions. In this turning, a relief angle was set to 7°. Accordingly, the breakage resistance was evaluated in accordance with a below-described evaluation method. Here, in Example 3, each of the above-described turning tools of samples 1-1 and 2-1 was also subjected to the below-described evaluation on breakage resistance.

(Cutting Conditions)
Workpiece: aluminum alloy A390 (eight intermittent grooves)
Cutting speed (Vc): 800 m/minute
Amount of cut (ap): 0.3 mm
Feed (f): 0.3 mm/rev
Material of cutting oil: 2 mass % of water-soluble emulsion
<Evaluation>
(Breakage Resistance)
As the evaluation on breakage resistance, a processing distance (an unit thereof is km) in which the above-described turning could be performed until occurrence of chipping of more than or equal to 0.02 mm was measured in each of the cutting edge portions of the turning tools of samples 1-1, 2-1 and 3-1 to 3-8. It is understood that as a sample attains a longer processing distance, the sample is more excellent in breakage resistance. Results thereof are shown in Table 3.

TABLE 3

|  | Amount of N (ppm) | Processing Distance (km) |
| --- | --- | --- |
| Sample 1-1 | 50 | 80 |
| Sample 2-1 | 50 | 120 |
| Sample 3-1 | 1 | 60 |
| Sample 3-2 | 100 | 160 |
| Sample 3-3 | 1 | 80 |
| Sample 3-4 | 100 | 200 |
| Sample 3-5 | 0.5 | 15 |
| Sample 3-6 | 105 | 5 |
| Sample 3-7 | 0.5 | 10 |
| Sample 3-8 | 105 | 3 |

According to Table 3, it is understood that each of the turning tools of samples 1-1, 2-1 and 3-1 to 3-4 in each of which the content of the nitrogen atoms included in the CVD single-crystal diamond is more than or equal to 1 ppm and less than or equal to 100 ppm exhibits a more excellent breakage resistance than those of the turning tools of samples 3-5 to 3-8 in each of which the content of the nitrogen atoms falls out of the above-described range.

Example 4

<Production of Cutting Edge Portion Composed of CVD Single-Crystal Diamond>
By using the same method as that in Example 1, a cutting edge portion composed of a CVD single-crystal diamond was manufactured. In an Example 4, for a cutting test described later, a total of 2 cutting edge portions of samples 4-1 and 4-2 were produced.
However, in Example 4, for each of the cutting edge portions of samples 4-1 and 4-2, in grinding and polishing the growth layer (CVD single-crystal diamond) to obtain the cutting edge portion, the vertex angle was as shown in Table 4. Also, for each of the cutting edge portions of samples 4-1 and 4-2, the direction of the line of intersection between the rake face and the bisecting cross section of the vertex angle of the nose curvature was matched to the <110> direction of the CVD single-crystal diamond (the off angle was 0°). The above-described Laue camera method was used to specify the crystal direction of the CVD single-crystal diamond.
<Production of Turning Tool>
By using the same method as that in Example 1, a turning tool of each of samples 4-1 and 4-2 was produced.
<Cutting Test>
A cutting test was performed onto each of the turning tools of samples 4-1 and 4-2 under the same cutting conditions as those in Example 1 except that the turning was performed with a relief angle shown in Table 4. Specifically, for each of samples 4-1 and 4-2, the same curvature radius, feed, off angle, and cutting conditions as those of sample 1-10 were employed. However, in the evaluation on each of the turning tools of samples 4-1 and 4-2, the surface roughness (Ra), the flank wear width at the region of the cutting edge corresponding to the position at which the depth of cut of the workpiece was maximum, and the flank wear width at the front cutting edge boundary portion of the cutting edge were measured only at a point of time at which the cutting distance reached 60 km as a result of the above-described turning. Further, a cutting distance (km) at a point of time of formation of a burr having a height of more than or equal to 0.1 mm was measured. Results thereof are shown in Table 4.

TABLE 41

|  | Vertex Angle | Relief Angle | Surface Roughness [Ra] 60 km | Flank Wear Width (Point with Maximum Depth of Cut) 60 km | Flank Wear Width (Front Cutting Edge Boundary Portion) 60 km | Formation of Burr |
| --- | --- | --- | --- | --- | --- | --- |
| Sample 4-1 | 85 | 7 | 9.837 | 16.259 | 5.475 | 44 km |
| Sample 4-2 | 60 | 12 | 10.463 | 17.537 | 8.06 | 32 km |

According to Table 4, it is understood that each of the turning tools of samples 4-1 and 4-2 has a small value of surface roughness (Ra). That is, each of the turning tools of samples 4-1 and 4-2 can attain a smoothly finished processed surface of the workpiece. Further, in view of the value of the flank wear width at the region of the cutting edge corresponding to the position at which the depth of cut of the workpiece is maximum as well as the value of the flank wear width at the front cutting edge boundary portion, it is understood that each of the turning tools of samples 4-1 and 4-2 has a wear resistance allowing for turning under a severe condition.

Heretofore, the embodiments and examples of the present disclosure have been illustrated, but it has been initially expected to appropriately combine configurations of the embodiments and examples.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: turning tool; 2: base material; 3: cutting edge portion; 4: rake face; 5: flank face; 6: cutting edge; 8: chamfer; 10: holder portion; Z: workpiece.

The invention claimed is:

1. A turning tool used for turning, the turning tool comprising: a holder portion; and a cutting edge portion fixed to the holder portion, wherein the cutting edge portion is composed of a synthetic single-crystal diamond, the synthetic single-crystal diamond is a CVD single-crystal diamond, the CVD single-crystal diamond includes more than or equal to 1 ppm and less than or equal to 100 ppm of hydrogen, the cutting edge portion includes a rake face, a flank face, and a cutting edge disposed at a crossing portion at which the rake face and the flank face cross each other, and the cutting edge portion has a nose curvature having a curvature radius of more than or equal to 0.1 mm and less than or equal to 1.2 mm, and the nose curvature satisfies at least one of a condition that a direction of a line of intersection between the rake face and a bisecting cross section of a vertex angle of the nose curvature is within ±10° relative to a <110> direction of the synthetic single-crystal diamond, and a condition that the direction of the line of intersection between the rake face and the bisecting cross section of the vertex angle of the nose curvature is within ±10° relative to a <100> direction of the synthetic single-crystal diamond.

2. The turning tool according to claim 1, wherein the direction of the line of intersection is within ±5° relative to the <110> direction of the synthetic single-crystal diamond.

3. The turning tool according to claim 1, wherein the direction of the line of intersection is within ±5° relative to the <100> direction of the synthetic single-crystal diamond.

4. The turning tool according to claim 1, wherein the synthetic single-crystal diamond includes more than or equal to 1 ppm and less than or equal to 100 ppm of nitrogen atoms.

5. The turning tool according to claim 1, wherein the vertex angle is more than or equal to 55° and less than or equal to 90°.

6. The turning tool according to claim 1, wherein the turning is performed under a condition that a relief angle is more than or equal to 7° and less than or equal to 15°.

7. The turning tool according to claim 1, wherein the turning is performed under a condition that a feed f is more than or equal to 0.01 mm/rev and less than 0.7 mm/rev.

* * * * *